(12) United States Patent
Machida et al.

(10) Patent No.: US 8,278,910 B2
(45) Date of Patent: Oct. 2, 2012

(54) PHASE LOCKED LOOP FOR CONTROLLING MOTOR AND SPINDLE MOTOR USING THE SAME

(75) Inventors: Hidekazu Machida, Kyoto (JP);
Michinobu Kambara, Kyoto (JP);
Takeshi Hasegawa, Hyogo (JP);
Fumihiko Shinoda, Hyogo (JP)

(73) Assignee: ShinMaywa Industries, Ltd., Hyogo (JP)

( * ) Notice: Subject to any disclaimer, the term of this patent is extended or adjusted under 35 U.S.C. 154(b) by 262 days.

(21) Appl. No.: 12/723,826

(22) Filed: Mar. 15, 2010

(65) Prior Publication Data

US 2010/0327853 A1    Dec. 30, 2010

(30) Foreign Application Priority Data

Jun. 25, 2009    (JP) .................................. 2009-151029

(51) Int. Cl.
*G01P 3/48* (2006.01)
(52) U.S. Cl. ................. 324/166; 324/207.25; 455/114.2
(58) Field of Classification Search .................. 388/911; 318/244–252
See application file for complete search history.

(56) References Cited

U.S. PATENT DOCUMENTS

| | | | | |
|---|---|---|---|---|
| 4,348,625 A | * | 9/1982 | Sharp ............................ | 318/757 |
| 5,276,569 A | * | 1/1994 | Even ........................... | 360/73.02 |
| 6,222,362 B1 | * | 4/2001 | Schulter et al. ........... | 324/207.25 |
| 6,901,039 B1 | * | 5/2005 | Sugie et al. ................ | 369/47.28 |
| 2008/0239889 A1 | * | 10/2008 | Ueno .......................... | 369/44.13 |

FOREIGN PATENT DOCUMENTS

| | | |
|---|---|---|
| JP | 63-101279 | 5/1988 |
| JP | 10-163862 | 6/1998 |
| JP | 11-055113 | 2/1999 |
| JP | 11055113 A * | 2/1999 |
| JP | 2001-274683 | 10/2001 |
| JP | 2008-147788 | 6/2008 |

OTHER PUBLICATIONS

Notice of Reasons for Rejection for corresponding Japanese Application No. 2009-151029 dated Jan. 19, 2010 and English translation.
Decision of Rejection for corresponding Japanese Application No. 2009-151029 dated Apr. 13, 2010 and English translation.

* cited by examiner

*Primary Examiner* — Huy Q Phan
*Assistant Examiner* — Temilade S Rhodes-Vivour
(74) *Attorney, Agent, or Firm* — Renner, Otto, Boisselle & Sklar, LLP (57) ABSTRACT

A PLL for controlling a motor includes first and second feedback loops. The first feedback loop includes an oscillator for generating a signal having a frequency corresponding to an input voltage, a first phase comparator for outputting a first phase difference signal corresponding to a phase difference between the signal from the oscillator and an input signal, and a first smoothing filter for smoothing the first phase difference signal to output the smoothed signal as the input voltage. The second feedback loop includes a second phase comparator for outputting a second phase difference signal corresponding to a phase difference between a signal having a frequency corresponding to a rotational speed of the motor and the input signal, an adder for adding the first and second phase difference signals, and a second smoothing filter for smoothing an output of the adder to output the smoothed signal to the motor.

4 Claims, 7 Drawing Sheets

PHASE LOCKED LOOP FOR CONTROLLING MOTOR AND SPINDLE MOTOR USING THE SAME

CROSS-REFERENCE TO RELATED APPLICATION

This application claims priority to Japanese Patent Application No. 2009-151029 filed on Jun. 25, 2009, the disclosure of which including the specification, the drawings, and the claims is hereby incorporated by reference in its entirety.

BACKGROUND

The present disclosure relates to a phase locked loop (PLL) including a plurality feedback loops coupled together.

Figure 8:
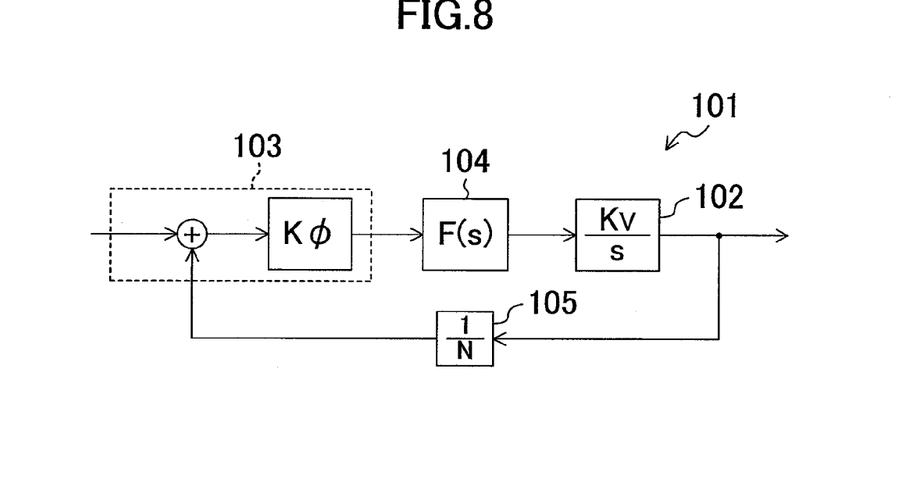
FIG. 8 is a block diagram illustrating a circuit example of a known PLL.

PLLs including a feedback loop having an oscillator for outputting an oscillating signal according to an input, and a phase comparator for obtaining a phase difference (phase deviation) between the oscillating signal and an input signal and outputting a signal corresponding to the phase deviation to the oscillator have been known. Such a PLL is configured, for example, as shown in FIG. 8, such that an input signal to a circuit 101 and an oscillating signal output from an oscillator 102 (an output signal from a frequency divider 105 in an example shown in FIG. 8) are compared by a phase comparator 103 to output a signal corresponding to the comparison result to the oscillator 102. Thus, a PLL allowing synchronization of the phase of the signal output from the oscillator 102 with the phase of the input signal can be obtained. In FIG. 8, the reference character 104 denotes a loop filter.

In a PLL having the above-described configuration, when the frequency of an input signal to the PLL is constant, a difference between the phases of the input signal and a signal output from the oscillator 102 can be substantially eliminated. However, when the frequency of an input signal varies, a difference between the phases of the input signal and the signal output from the oscillator 102 cannot be reduced to zero. Also, in the PLL, pull-in fluctuation, which is caused when an input phase in the phase comparator is pulled in or out in the course of pulling the frequency of an output signal into the frequency of the input signal from a non-synchronized state.

Figure 9:
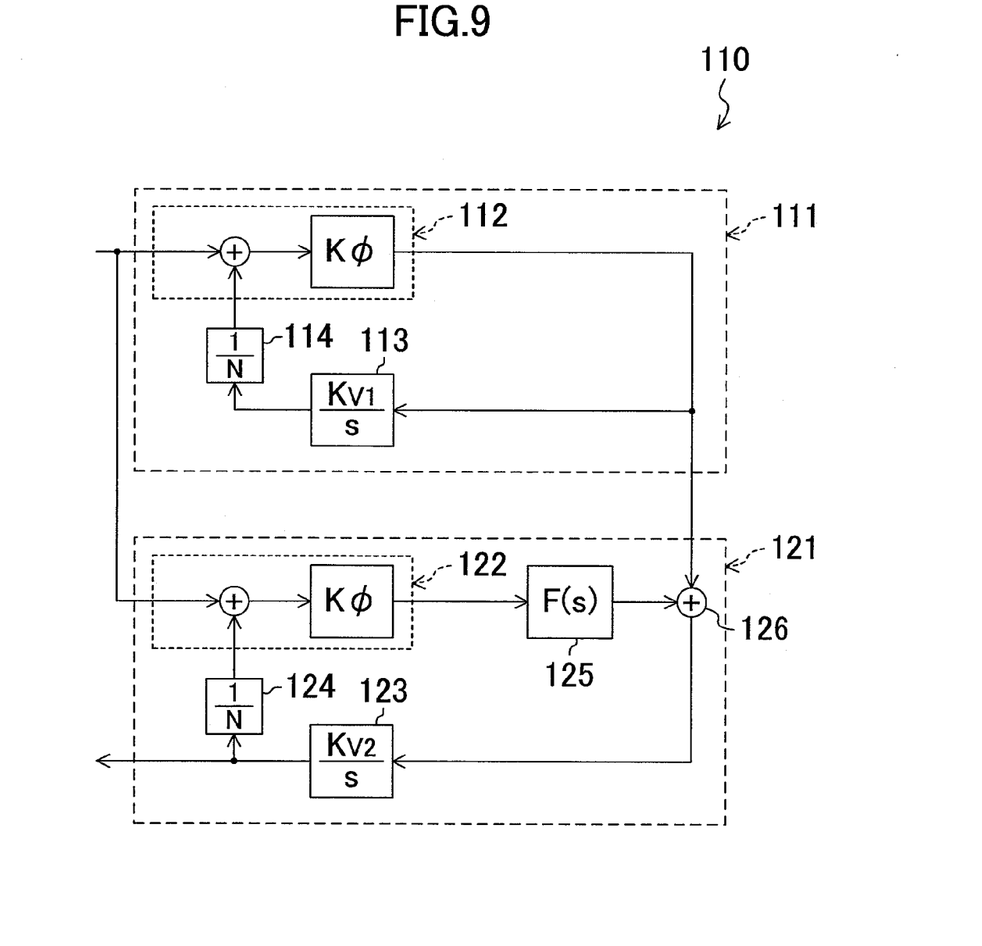
FIG. 9 is a block diagram illustrating a circuit example of a known dual loop PLL.

Thus, in order to deal with the above-described pull-in fluctuation caused when the frequency of an input signal varies, a so-called dual loop PLL in which two of the above-described PLLs are combined has been proposed. Such a dual loop PLL is described in, for example, Japanese Patent Application No. 2008-147788, and is also shown in FIG. 9. In the dual loop PLL, since one PLL is a feedforward element of the other PLL, fast tracking can be achieved, so that a period in which the pull-in fluctuation occurs can be reduced. Furthermore, with the frequencies of an input signal and an output signal synchronized, the phase deviation is kept close to zero even when the frequency of the input signal increases or decreases. Therefore, the phases of inputs to the phase comparator hardly become out of a range in which the phase comparator can perform phase comparison, and the pull-in fluctuation hardly occurs.

Specifically, in an example dual loop PLL 110 of FIG. 9, an adder 126 adds a signal output from a phase comparator 112 of a first PLL 111 to a signal output from a phase comparator 122 of a second PLL 121 and smoothed by a loop filter 125. A resultant value is input to an oscillator 123 of the second PLL 121. By configuring the dual loop PLL 110 to have the above-described configuration, a phase deviation obtained by the phase comparator 112 of first PLL 111 can be reflected to an input to the oscillator 123 of the second PLL 121. Thus, a good responsivity to variation in the frequency of the input signal can be provided, and the phase deviation can be reduced to be close to zero with high accuracy. In FIG. 9, the reference characters 113, 114 and 124 denote an oscillator of the first PLL 111, a frequency divider of the first PLL 111, and a frequency divider of the second PLL 121, respectively.

The above-described the dual loop PLL configuration is used in communication devices and broadcast receivers for receiving a signal transmitted from a high speed moving body such as an artificial satellite and the like for the purpose of eliminating steady-state errors caused by Doppler shift (frequency shift). In contrast to such use, the present inventor has conceived of use of a dual loop PLL in drive control of a motor or the like which is accelerated or decelerated, instead of such communication devices.

Figure 3A:
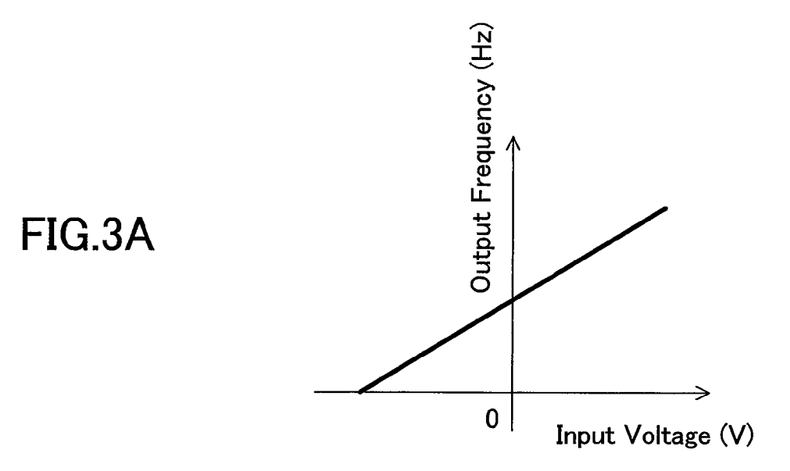
FIG. 3A is a graph showing an example input/output characteristic of an oscillator.
Figure 3B:
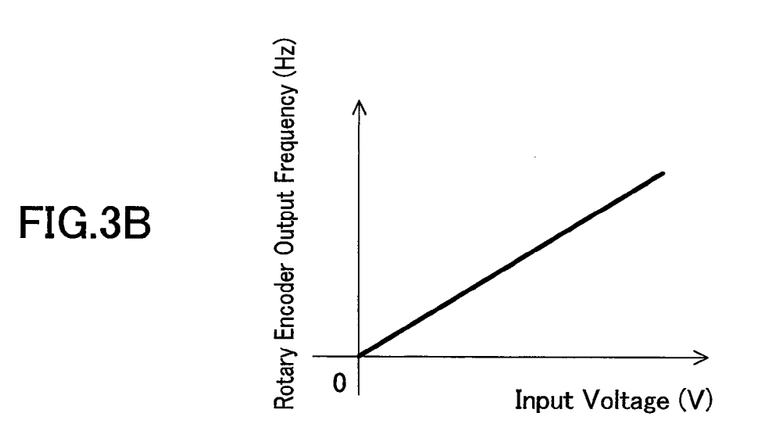
FIG. 3B is a graph showing an example input/output characteristic of a motor.

However, characteristics of motors are greatly different from those of communication devices, and therefore, if the known example configuration of the dual loop PLL described above is applied to drive control of a motor, drive control of the motor itself is difficult. Specifically, as shown in FIGS. 3A and 3B, although the oscillator of the PLL is configured to output a positive output signal even when the polarity of an input value (input voltage) is changed (see FIG. 3A), but the rotation direction of the motor is changed depending on the polarity of an input value (input voltage) in the motor (see FIG. 3B). Thus, when the oscillator 123 of the second PLL 121 of FIG. 9 is merely replaced with a motor including an encoder, the rotation direction of the motor is changed according to the polarity of an input value, so that drive control of the motor is impossible. Therefore, the application of the above-described configuration of the dual loop PLL to drive control of a motor is theoretically difficult.

Based on the foregoing, the PLL of FIG. 8 is applicable to drive control of a motor only when the frequency of an input signal is constant for the reason that the phase deviation with respect to variation in the frequency of the input signal cannot be reduced to zero, the pull-in fluctuation occurs, and the like. Also, because of the above-described characteristics of motors, the dual loop PLL of FIG. 9 cannot be applied to drive control of a motor.

SUMMARY

In view of the foregoing, the present invention has been devised, and it is therefore an object of the present invention to provide a circuit configuration which allows application of a multiple loop PLL to drive control of a motor in which the frequency of an input signal is changed.

To achieve the above-described object, in a PLL for controlling a motor according to the present invention, two PLLs are coupled together in parallel, respective outputs of phase comparators of the two PLLs are added, and smoothing filters are respectively provided at respective input sides of an oscillator and a motor.

Specifically, a phase locked loop (PLL) for controlling a motor according to the present invention includes a first feedback loop and a second feedback loop. The first feedback loop includes an oscillator configured to generate a signal having a frequency corresponding to an input voltage to output the generated signal, a first phase comparator configured to output a first phase difference signal corresponding to a phase difference between the signal output from the oscillator and an input signal, and a first smoothing filter configured to smooth the first phase difference signal to output the smoothed signal as the input voltage to the oscillator. The second feedback loop includes a second phase comparator configured to output a second phase difference signal corresponding to a phase difference between a signal having a frequency corresponding to a rotational speed of the motor and the input signal, an adder configured to add the first phase difference signal and the second phase difference signal to output the resultant signal, and a second smoothing filter configured to smooth the signal output from the adder to output the smoothed signal to the motor.

The above-described configuration includes two feedback loops, and thus, even when the frequency of an input signal varies, an output signal having almost no phase deviation with respect to the phase of the input signal can be generated. Specifically, the first phase comparator of the first feedback loop obtains a phase difference (phase deviation) between an output signal and an input signal in the first feedback loop, and the phase deviation is added to an output of the second phase comparator of the second feedback loop. Thus, drive control of a motor can be performed while the phase deviation obtained in the first feedback loop is taken into account. That is, the first feedback loop feedforwards the phase difference between the input signal and the output signal to the second feedback loop, so that the phase deviation can be reduced to almost zero even when the motor is accelerated or decelerated, and the motor can be driven with a good responsivity to the input signal.

Also, the second smoothing filter is provided at the input side of the motor of the second feedback loop, and thus, a signal input to the motor can be smoothed. Therefore, with the second smoothing filter provided, even when an output from the phase comparator of the first feedback loop or the second feedback loop has a negative value, a negative signal is prevented from being input to the motor. Accordingly, reverse rotation of the motor can be prevented, so that drive control of the motor is allowed.

Furthermore, the first smoothing filter is provided at the input side of the oscillator of the first feedback loop, and thus, a smoothed value can be input to both of the oscillator of the first feedback loop and the motor of the second feedback loop. Thus, both of the loops can be configured to have the same configuration, so that a signal corresponding to both of the loops can be input to the adder for coupling the loops together. Therefore, the above-described two feedback loops are employed, and thus, even when the frequency of an input signal varies, drive control of the motor can be performed with a phase deviation of almost zero.

The above-described PLL may include multiple ones of the first feedback loop, or may include only one first feedback loop.

When the PLL includes only one first feedback loop, the PLL includes only a small number of components, and the configuration thereof is simplified, but drive control of the motor can be performed with respect to variation in the frequency of the input signal while a phase deviation is almost zero. Therefore, a compact drive controller for a motor can be configured.

A spindle motor according to an example embodiment of the present invention includes the above-described PLL, a rotary shaft configured to be driven according to the smoothed signal output from the second smoothing filter of the PLL, and a rotary encoder configured to generate the signal having the frequency corresponding to the rotational speed of the motor according to a rotation of the rotary shaft.

Thus, even when the motor is accelerated or decelerated, the motor can be rotated while the phase of the motor is not largely shifted from the input signal. Therefore, even when the frequency of a signal input to the motor varies, the phase of the motor can be maintained to be synchronized with the phase of the input signal (or locked), so that the rotation of the motor can be caused to track the input signal with high accuracy.

A test apparatus for testing an object by rotating the object according to an example embodiment of the present invention includes the above-described spindle motor, and a table, attached to the rotary shaft, configured to rotate the object. The apparatus rotates an object attached to the table to perform a test of the object.

Thus, a time required for the motor to reach a constant rotational speed can be reduced, so that a test time required for detecting runout, dirt and the like of the object can be reduced. Therefore, a test can be efficiently performed.

Based on the foregoing, according to the present invention, a multiple loop PLL can be applied to drive control of a motor, and the phase of the motor can be synchronized with an input signal at high speed and with high accuracy.

Moreover, the first feedback loop carries out the feedforward function, so that high speed response with respect to variation in the frequency of an input signal is allowed. Assume that an embodiment of the present invention is incorporated in an apparatus and is applied to drive control of a motor. In such a case, when the motor is decelerated or accelerated due to disturbance or the like, the apparatus detects such a variation in the rotational speed of the motor and outputs to the multiple loop PLL a command for acceleration when the motor is decelerated, and a command for deceleration when the motor is accelerated. Conventionally, if a synchronization state with the phase of the input signal (so-called locked state) cannot be maintained due to disturbance, the pull-in fluctuation occurs, and it requires a significant time to return to the locked state. However, by utilizing high speed responsivity with respect to variation in the frequency of an input signal which can be obtained according to the present invention, even when a PLL is out of a locked state, the PLL can be brought back to the locked state in a short time.

BRIEF DESCRIPTION OF THE DRAWINGS

FIGS. 4A-4C are diagrams illustrating waveforms of an input signal IN, an output signal I from a first PLL, and an output signal II of an encoder.

FIGS. 5A-5C are graphs showing results of calculation of the phase of an output signal with respect to an input signal using MATLAB.

DETAILED DESCRIPTION

Example embodiments of the present invention will be described in detail hereinafter with reference to the accompanying drawings. Like reference characters are employed in the drawings and in the description of the preferred example embodiments to represent the same or similar components.

Configuration of Test Apparatus

Figure 1:
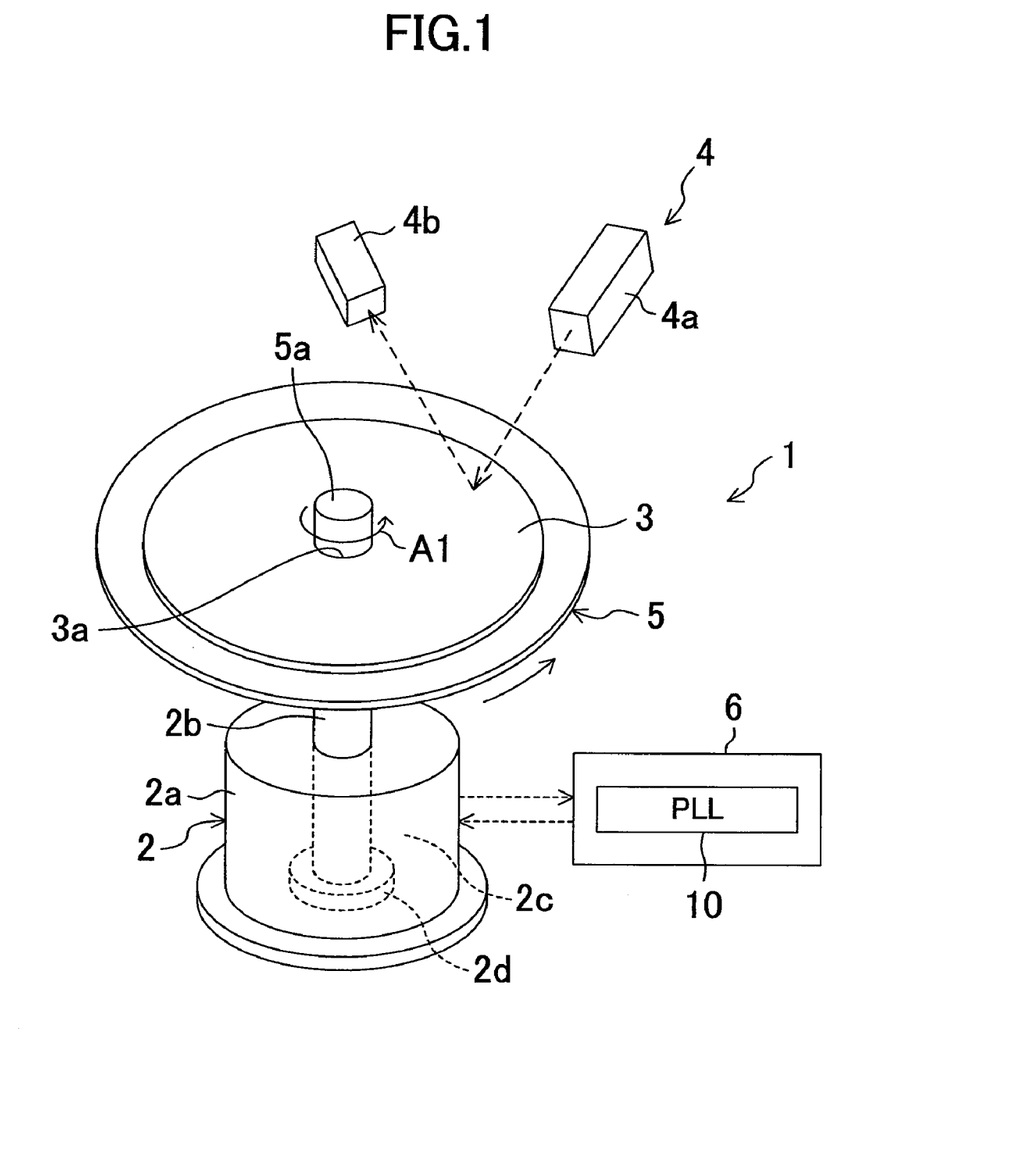
FIG. 1 is a perspective view illustrating a test apparatus according to an example embodiment of the present invention.

FIG. 1 is a schematic view of a test apparatus 1 for testing an object 3 by rotating the object, according to an example embodiment of the present invention. First, the entire configuration of the test apparatus 1 including a motor 2 (which is a motor for a test apparatus) employing a PLL 10 (for controlling a motor) of an example embodiment of the present invention will be described with reference to FIG. 1. The test apparatus 1 includes the motor 2, a detection mechanism 4, a chuck table 5, and a drive controller 6. The test apparatus 1 of FIG. 1 is configured such that the object 3 (which is, in this example embodiment, a circular disk and will be hereinafter occasionally referred to merely as a "disk") is rotated by the motor 2 and defects such as scratches and dirt on a surface of the object 3, and runout of the object 3 when being rotated are detected by the detection mechanism 4.

The motor 2 is a so-called spindle motor, and includes a rotary shaft 2b rotatably supported in a motor housing 2a, a driving section 2c for rotating the rotary shaft 2b, and a rotary encoder 2d. Although not shown in FIG. 1, the driving section 2c of the motor 2 includes a rotor provided to the rotary shaft 2b and a stator provided in the motor housing 2a. The motor 2 is configured such that a rotating magnetic field is generated by the driving section 2c to rotate the rotor, thereby supplying rotation driving force to the rotary shaft 2b.

The rotary shaft 2b is rotatably supported by a bearing (not shown) provided in the motor housing 2a, and one end of the rotary shaft 2b protrudes outwardly from the motor housing 2a. The rotary encoder 2d for obtaining the rotational speed of the rotary shaft 2b is arranged at the opposite side to the protruding end of the rotary shaft 2b such that a part of the rotary encoder 2d is embedded in the motor housing 2a. The chuck table 5 having a substantially circular plate shape for fixing the object 3 is attached to the protruding end of the rotary shaft 2b to be rotated concentrically with the rotary shaft 2b.

In the motor 2, rotation control of the rotary shaft 2b is performed by the drive controller 6. The drive controller 6 is configured such that the rotational speed of the rotary shaft 2b of the motor 2 is obtained by the rotary encoder 2d, and the rotary shaft 2b of the motor 2 is rotated according to a signal from the rotary encoder 2d. The drive controller 6 includes a PLL 10 for synchronizing the phase of an input signal as a command signal with the phase of an output signal from the rotary encoder 2d. This will be described in detail later. The rotary encoder 2d outputs a signal according to the rotation of the rotary shaft 2b of the motor 2 to the PLL 10. The motor 2 may include the drive controller 6.

The object 3 is a circular disk which is used, for example, as a magnetic disk for a hard disk drive, and a hole 3a is formed at the center thereof when viewed from the top so as to have a proper size which allows a protruding portion 5a of the chuck table 5 to fit the hole 3a. The object 3 is not limited to such a magnetic disk, but may be any type of disk that can be rotated and tested.

The detection mechanism 4 includes a light source 4a and a photodetector 4b, and is configured to output a laser beam from, for example, the light source 4a and receive light reflected on the object 3 at the photodetector 4b. The detector mechanism 4 detects defects such as scratches and dirt on the surface of the object 3, and runout of the object 3 when being rotated by detecting the reflected light by the photodetector 4b. The detection mechanism 4 is configured to perform the detection using laser beam to examine a surface state of the object 3. However, the configuration of the detection mechanism 4 is not limited thereto, but the detection mechanism 4 may have any configuration that allows examination of the surface state of the object 3 being rotated.

In FIG. 1, an arrow A1 represents the rotation direction of the rotary shaft 2b of the motor 2 and the object 3.

Configuration of PLL

Next, a configuration of the PLL 10 in the drive controller 6 will be described with reference to FIGS. 2-5.

Figure 2:
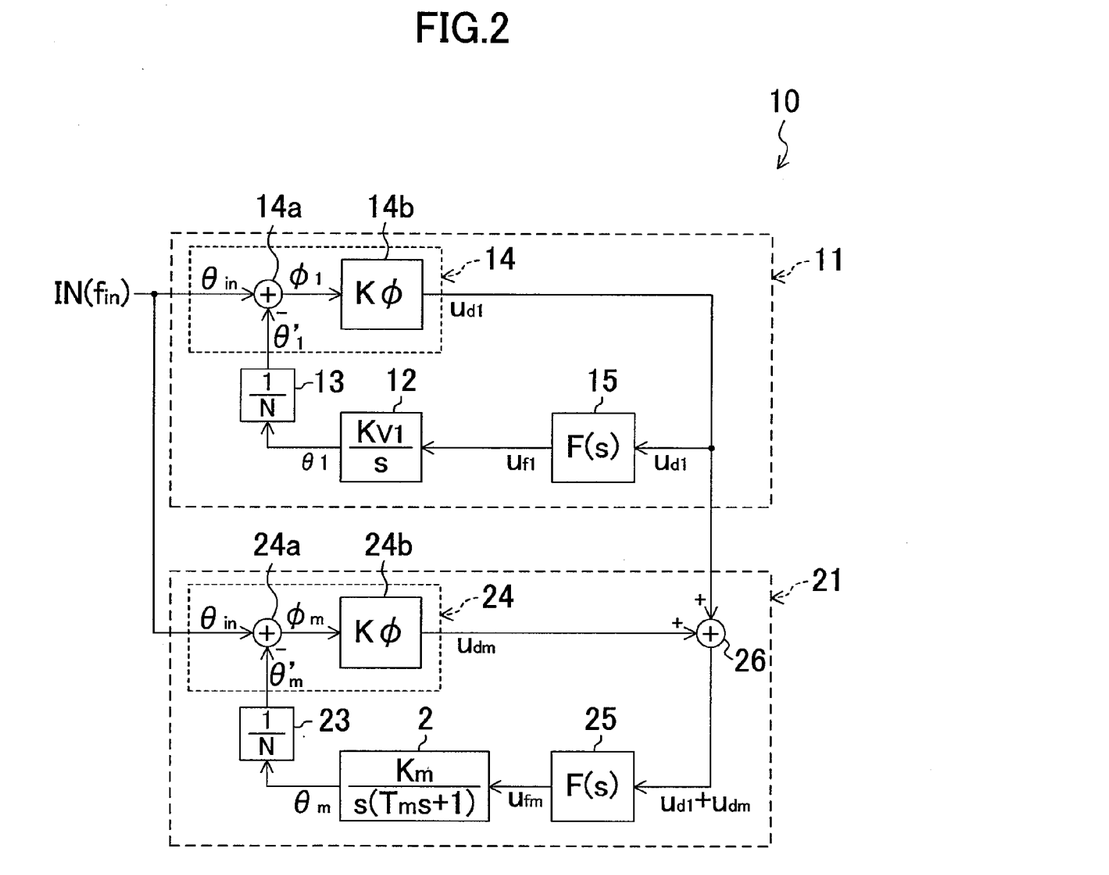
FIG. 2 is a block diagram illustrating an example configuration of a PLL according to an example embodiment of the present invention.

FIG. 2 is a block diagram illustrating an example configuration of the PLL 10 according to an example embodiment of the present invention. The PLL 10 of FIG. 2 includes a first PLL 11 (a first feedback loop) and a second PLL 21 (a second feedback loop). The PLL 10 is a dual loop PLL in which the first PLL 11 and the second PLL 21 are coupled in parallel. The first PLL 11 obtains a phase difference (hereinafter referred to as a "phase deviation") $\phi_1$ between the input signal IN (frequency $f_{in}$, phase $\theta_{in}$) and an output signal (phase $\theta_1'$). The second PLL 21 obtains a phase difference $\phi_m$ between the input signal IN and an output signal (phase $\theta_m'$). The PLL 10 performs drive control of the motor 2, based on the phase deviation $\phi_l$, $\phi_m$, so that the phase deviation $\phi_m$ becomes zero at the second PLL 21.

Specifically, the first PLL 11 includes an oscillator 12 for outputting a signal having an oscillation frequency (phase $\theta_1$) corresponding to a voltage $U_{fl}$ of an input signal, a frequency divider 13 for performing a frequency division such that the frequency of an output signal of the oscillator 12 is N times the frequency of the input signal IN (where N is a natural number), and a first phase comparator 14 for comparing the phase $\theta_1'$ of an output signal of the frequency divider 13 with the phase $\theta_{in}$ of the input signal IN and outputting the comparison result to the oscillator 12. That is, the first PLL 11 is configured such that the phase deviation $\phi_1$ obtained by the first phase comparator 14 is fed back to the oscillator 12.

The oscillator 12 is a voltage control oscillator (VCO) for adjusting an oscillation frequency of an output signal according to the input voltage. The VOC outputs a signal of which frequency corresponds to the input voltage, even when the input voltage is negative, as an output characteristic thereof of FIG. 3A shows. When the PLL 10 deals with a digital signal, a numerically controlled oscillator (NCO) capable of digital signal processing may be used as the oscillator 12.

The frequency divider 13 is configured to perform frequency division such that the frequency of an output signal from the frequency divider 13 becomes 1/N of the frequency of an input signal to the frequency divider 13. Thus, in the first PLL 11, when feedback control of the oscillator 12 is performed such that the phase deviation $\phi_1$ is substantially eliminated in the phase comparator 14, a signal having a frequency N times the frequency of the input signal IN can be obtained as an output of the oscillator 12.

The first phase comparator 14 includes a subtracter 14a for subtracting the phase $\theta_1{}'$ of an output signal from the phase $\theta_{in}$ of the input signal IN, and a converter 14b for converting a signal output from the subtracter 14a into the input signal to the oscillator 12. That is, the first phase comparator 14 is configured such that the phase difference $\phi_1$ between the input signal and the output signal is converted into a signal which can be input to the oscillator 12.

The second PLL 21 includes a frequency divider 23 for outputting a signal having a frequency 1/N times the frequency of an output signal of the motor 2, and a second phase comparator 24 for comparing the phase $\theta_m{}'$ of an output signal of the frequency divider 23 with the phase $\theta_{in}$ of the input signal IN and outputting the comparison result to the motor 2. That is, the second PLL 21 is also configured such that the phase deviation $\theta_m$ obtained by the second phase comparator 24 is fed back to the motor 2. The motor 2 is rotated at a rotational speed corresponding to an input voltage. The rotary encoder 2d of the motor 2 outputs a signal of a frequency corresponding to the rotational speed of the rotary shaft 2b of the motor 2 to the frequency divider 23. The respective configurations of the frequency divider 23 and the second phase comparator 24 are the same as those of the frequency divider 13 and the first phase comparator 14 of the first PLL 11, respectively, and are not described herein. In FIG. 2, the reference characters 24a and 24b denote a subtracter and a converter, respectively.

The second PLL 21 includes an adder 26 for adding an output $U_{dl}$ of the first phase comparator 14 and an output $U_{dm}$ of the second phase comparator 24 such that the first PLL 11 is coupled thereto in parallel. The output $U_{dl}$ of the first phase comparator 14 of the first PLL 11 is added to the output $U_{dm}$ of the second phase comparator 24 of the second PLL 21 by the adder 26, and thus, drive control of the motor 2 can be performed such that the phase deviation $\phi_1$ obtained by the first PLL 11 is taken into account by the second PLL 21 and then substantially eliminated.

That is, in the PLL 10, the phase deviation q obtained by the first PLL 11 can be input to the second feedback loop 21 as a type of feedforward signal, and thus, the rotation of the motor 2 can be synchronized with the input signal IN at high speed and with good responsivity.

In the PLL 10, loop filters (first and second smoothing filters) 15 and 25 for smoothing a signal are provided, respectively, at an input side of the oscillator 12 of the first PLL 11, and between the motor 2 and the adder 26 (at an input side of the motor 2). The loop filters 15 and 25 function as integrators, and are configured to integrate and smooth input signals $U_{dl}$ and $U_{dl}+U_{dm}$ to output signals $U_{fl}$ and $U_{fm}$, respectively. With the loop filters 15 and 25 provided in the PLL 10, an order of s in the PLL 10 becomes 3, and thus, it becomes possible to reduce the phase deviation to zero, based on the internal model principle. That is, with the loop filters 15 and 25, even when the phase $\theta_{in}$ of the input signal to the PLL 10 varies (for example, when the motor is accelerated, decelerated or the like), the motor 2 can be driven substantially without causing a phase difference from the input signal.

As shown in FIG. 3B, the motor 2 has an output characteristic in which the motor 2 is reversely rotated according to the polarity of an input voltage. Therefore, when a negative voltage is input, the motor 2 is reversely rotated, and thus, not only drive control of the motor becomes difficult but also an apparatus might be damaged in the worst case. In contrast, as described above, the loop filter 25 is provided at the input side of the motor 2, i.e., between the adder 26 and the motor 2, and thus, the input signal to the motor 2 is integrated and smoothed. This prevents a negative voltage from being input to the motor 2. Thus, drive control of the motor 2 can be performed without reverse rotation of the motor 2.

The PLL 10 may be configured as an analog circuit or a digital circuit.

Reasons why the phase deviation can be reduced to zero with respect to the variation in frequency of the input signal IN in the PLL 10 having the above-described configuration can be theoretically explained also using the following Expressions 1 and 2. Specifically, in the PLL 10, assuming that the input phase $\theta_{in}$ is defined by Expression 1, a stationary phase deviation is defined by Expression 2.

[Expression 1]

$$\theta_{in} = \frac{R}{s^3} + \frac{\Delta\omega}{s^2} + \frac{\Delta\theta}{s} \quad (1)$$

[Expression 2]

$$\lim_{t\to\infty} \phi(t) = \frac{K_1 - K_2}{\frac{K_1 K_2}{\tau_1}} R = \frac{\tau_1 K_\phi (K_v - K_m)}{N K_1 K_2} R \quad (2)$$

$$K_1 = \frac{K_\phi K_v}{N}$$

$$K_2 = \frac{K_\phi K_m}{N}$$

In Expressions 1 and 2, R indicates a phase index, $\Delta\omega$ indicates a frequency step, $\Delta\theta$ indicates a phase step, $K\phi$ indicates the gain of the phase comparator 14, Kv indicates the gain of the oscillator 12, Km indicates a motor gain, N indicates a frequency multiplying factor, and $\tau_1$ indicates a time constant (phase lead).

In Expression (2), if Kv is equal to Km, i.e., the gain of the oscillator 12 is equal to the gain of the motor 2, the stationary phase deviation can be reduced to zero.

Figure 4A:
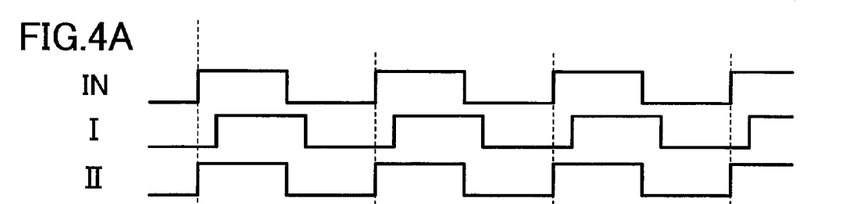
FIG. 4A illustrates waveforms in a predetermined initial state.
Figure 4B:
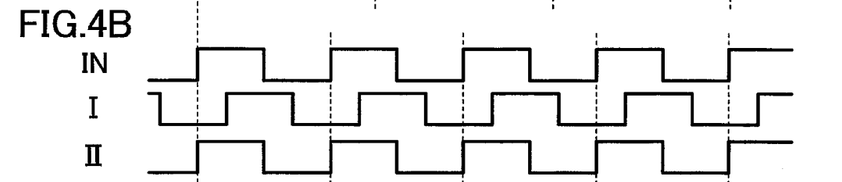
FIG. 4B illustrates waveforms when the frequency of the input signal IN is high (the motor is being accelerated).
Figure 4C:
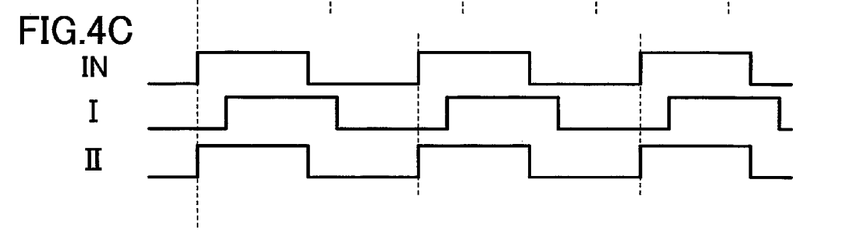
FIG. 4C illustrates waveforms when the frequency of the input signal IN is low (the motor is being decelerated).
Figure 5A:
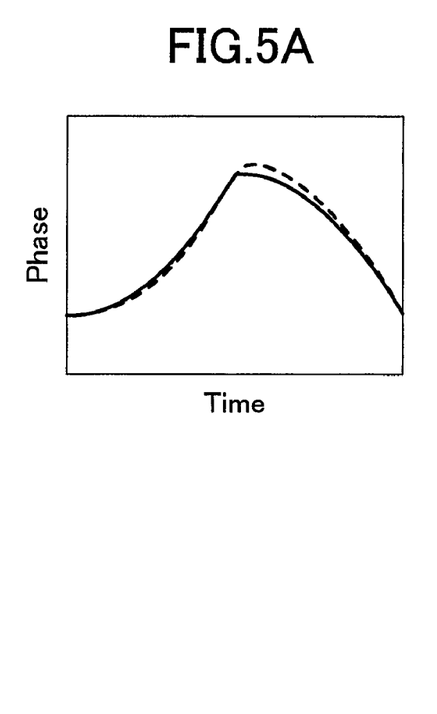
FIG. 5A shows calculation results obtained for a configuration including only a first PLL.
Figure 5B:
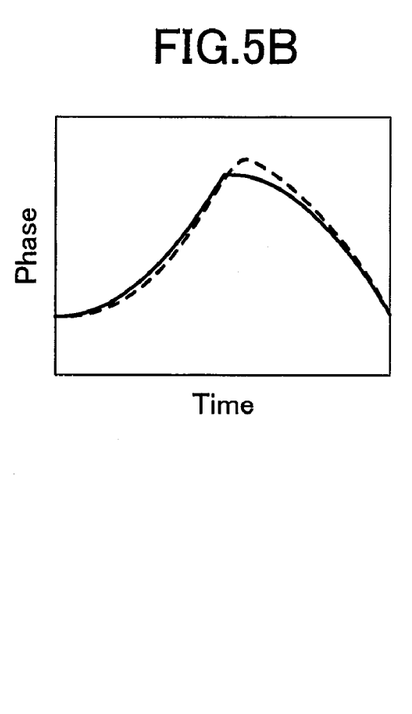
FIG. 5B shows calculation results obtained for a configuration including only a second PLL.
Figure 5C:
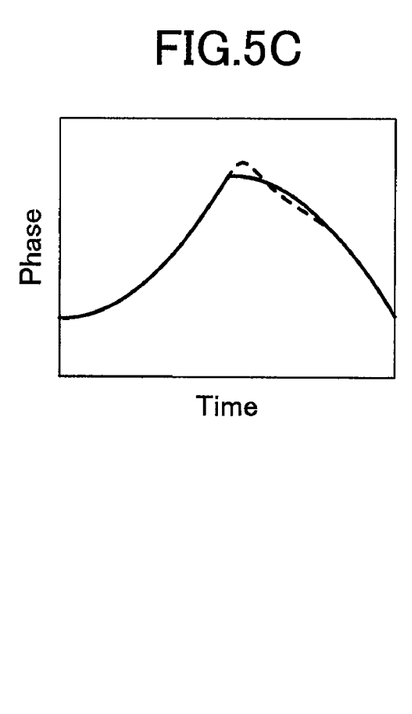
FIG. 5C shows calculation results obtained for a configuration including the PLL of FIG. 2.

Operation results of the PLL 10 are shown in FIGS. 4A-4C and FIGS. 5A-5C. FIGS. 4A-4C are diagrams showing variations in signal waveforms of an output signal I of the oscillator 12 of the first PLL 11 and an output signal II of the encoder of the motor 2 in comparison with a waveform of an input signal IN, when a field programmable gate array (FPGA) is implemented as the PLL 10 and the frequency of the input signal IN is varied. FIGS. 5A-5C are graphs showing results of calculation, using MATLAB (Version 5.2.1.29215a (R11.1) September 2), for transient response of an output signal in the configuration including only the first PLL 11 (FIG. 5A), in the configuration including only the second PLL 21 (FIG. 5B), and in the configuration including the PLL 10 (FIG. 5C).

As shown in FIGS. 4A-4C, when the frequency of the input signal IN is high (as shown in FIG. 4B where the motor is accelerated) with respect to a predetermined initial state (in FIG. 4A), and when the frequency of the input signal IN is low (as shown in FIG. 4C where the motor is decelerated) with respect to the predetermined initial state (in FIG. 4A), the output signal of the oscillator 12 of the first PLL 11 has a phase shifted from the phase of the input signal, but in contrast, the output signal of the encoder of the motor 2 has a phase which substantially matches the phase of the input signal IN. Therefore, in the configuration including the PLL 10 of FIG. 2, as shown in FIGS. 4A-4C, even when the frequency of the input signal varies, rotation of the motor 2 can be synchronized with the input signal IN by PLL 10 at high speed and with high accuracy.

As described above, it is evident also from the calculation results shown in FIGS. 5A-5C that the phase of the output signal can be synchronized with the phase of the input signal IN by the PLL 10. Specifically, as shown in FIGS. 5A-5C, the phase of the output signal (dashed line) cannot track the input signal IN (solid line) of which the phase varies and thus does not match the phase of the input signal IN in the configuration including only the first PLL 11 (FIG. 5A) and in the configuration including only the second PLL 21 (FIG. 5B). However, in the configuration including the PLL 10 (FIG. 5C), the output signal exhibits a quite good match with the phase of the input signal IN in a significant portion. Thus, it can be seen also from the calculation results that the phase of the output signal can be synchronized with the phase of the input signal by the PLL 10 at high speed and with high accuracy.

Operation of Test Apparatus

The operation of the test apparatus 1 having the above-described configuration will be hereinafter described with reference to FIGS. 6 and 7.

The test apparatus 1 described above is configured such that a disk 3 or the like as an object is rotated by the motor 2, and that the detection mechanism 4 detects scratches and dirt on a surface of the disk 3, and runout of the disk 3 when being rotated. Thus, in the test apparatus 1, when the detection mechanism 4 examines a surface state of the disk 3, it is required to rotate the disk 3 at a constant rotational speed in synchronization with the phase of the input signal.

Figure 6:
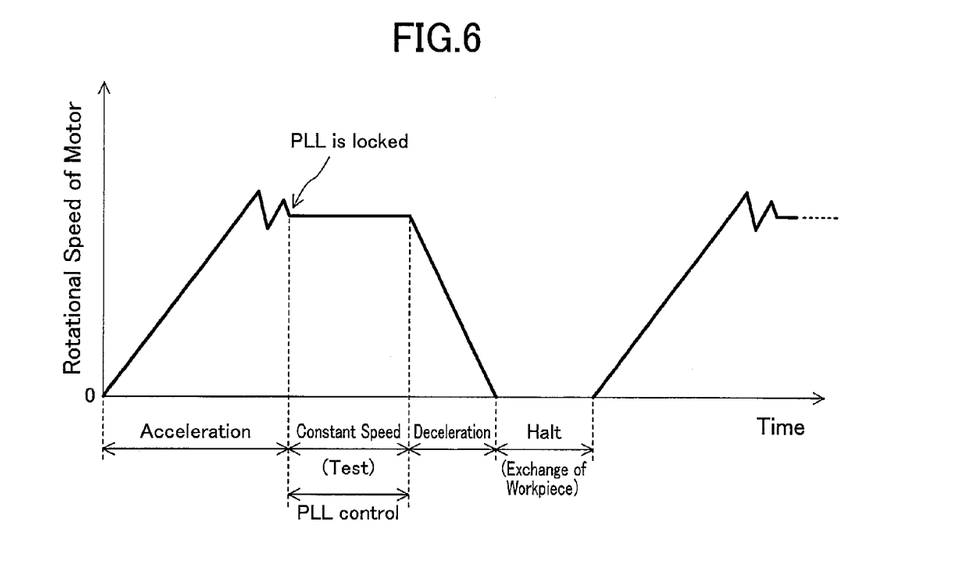
FIG. 6 is a graph showing an example operation of a known test apparatus.
Figure 7:
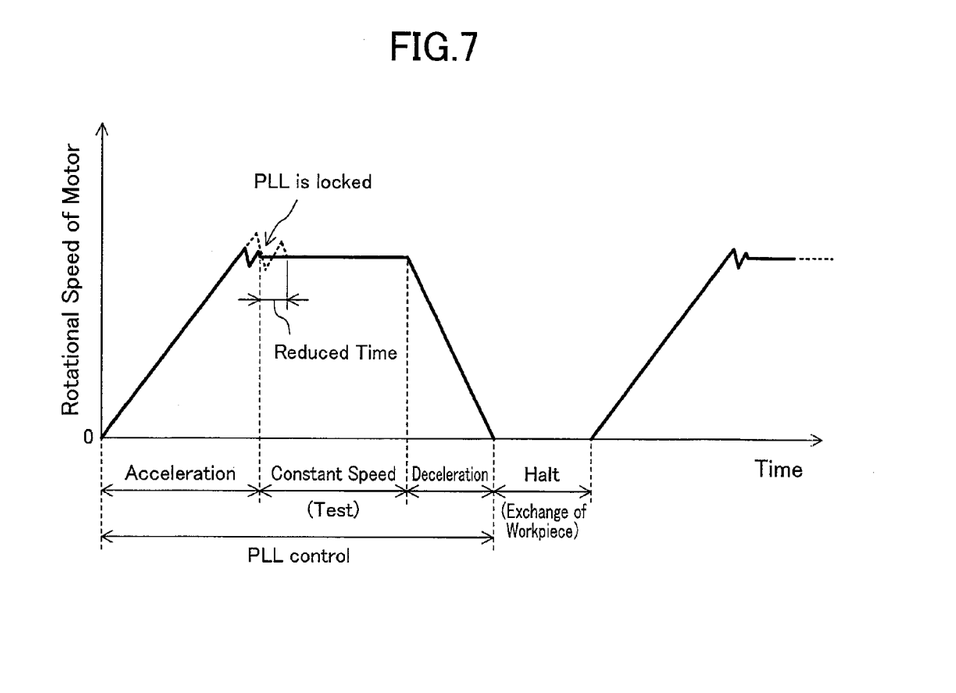
FIG. 7 is a graph showing a circuit example operation of a test apparatus according to an example embodiment of the present invention.

In a drive controller employing a known PLL, as shown in FIG. 6, when the motor is accelerated or decelerated, general speed control (feedback control) of the motor is performed and, when the rotational speed of the motor reaches a predetermined constant speed, rotational speed control of the motor is performed using the PLL.

Thus, in a known test apparatus, to improve test efficiency, measures such as reducing acceleration/deceleration time of the motor, and the like are taken. However, in such a case, torque up of the motor and increase in supply power are required, and accordingly, many disadvantages such as increase in the size of motor and in the amount of heat generation, and the like are caused.

In contrast, the test apparatus 1 having the above-described configuration includes the PLL 10 which allows synchronization of the phase of an output with the phase of the input signal IN even when the motor 2 is accelerated or decelerated (i.e., when the frequency of the input signal varies), and fast tracking of the phase of the output signal with respect to the input signal. Thus, as shown in FIG. 7, the motor 2 can be driven using PLL control except when the motor is halted. Therefore, a time required for the motor to reach a constant rotational speed necessary for a test can be reduced (the dashed line in FIG. 7 indicates variation in the motor rotational speed of FIG. 6), but conventionally required measures such as torque up of the motor and the like are not required.

Also, even when the PLL 10 is applied to a different type of apparatus such as, for example, an apparatus for rotating a motor at very low speed (for example, 0.01 rpm), drive control of the motor can be performed in synchronization with the input signal. Conventionally, when a motor is rotated at such very low speed, in performing speed control, an input command signal and a feedback signal become smaller, and thus, the speed control is greatly affected by disturbance, and in performing position control using a pulse train, it requires a considerable time for gain tuning. However, when the PLL 10 is used to rotate in synchronization with the input signal, rotation control can be performed at very low speed.

Advantages of Example Embodiments

As described above, the first PLL 11 and the second PLL 21 are coupled together such that an output of the first phase comparator 14 of the first PLL 11 is added to the input side of the motor 2 by the adder 26. Also, the loop filters 15 and 25 are provided, respectively, between the input side of the oscillator 12 of the first PLL 11 and the adder 26, and between the motor 2 and the adder 26. Thus, even when the phase of an input signal $\theta_{in}$ varies, the motor 2 can be rotated in synchronization with the input signal.

That is, in contrast to the configuration including only a single loop PLL in which it is not possible to output a signal synchronized with an input signal of which phase varies, a configuration which can output a signal synchronized with the input signal can be provided by configuring a dual loop PLL such that the two PLLs, i.e., the PLL 11 and the PLL 21 are coupled in parallel and drive control of the motor 2 is performed by one of the PLLs (the second PLL 21) while a phase deviation obtained by the other one of the PLLs (the first PLL 11) is taken into account.

To configure the above-described dual loop PLL, differences between the output characteristics of the motor 2 and the oscillator 12 are taken into account, and the loop filter 25 is provided between the motor 2 and the adder 26, as described above. Thus, reverse rotation of the motor 2 in response to a negative voltage input to the motor 2 can be reliably prevented. This allows control of the motor 2 using the dual loop PLL, and thus, a dual loop PLL for controlling a motor can be provided.

Furthermore, by application of the PLL 10 having the above-described configuration to the test apparatus 1 for testing the disk 3, a time for the disk to reach a constant rotational speed necessary for a test can be reduced, and thus, the test can be efficiently performed.

Other Examples

The above-described example embodiment may have the following configurations.

In the above-described example embodiment, the PLL 10 is configured as a dual loop PLL including combination of two PLLs, i.e., the PLL 11 and the PLL 21. However, the PLL 10 is not limited thereto, but may be configured as a multiple loop PLL including a plurality of PLLs combined together. In such a case, in the above-described example embodiment, multiple ones of the first PLL 11 may be provided in parallel to the second PLL 21. Thus, a computational load on the first PLL 11 can be reduced.

In the above-described example embodiment, the frequency dividers 13 and 23 are provided, respectively, at the output sides of the oscillator 12 and the motor 2. However, the configuration of the PLL 10 is not limited thereto, but the frequency dividers 13 and 23 do not have to be provided.

Also, in the above-described example embodiment, the loop filters 15 and 25 are used to smooth a signal. However, the configuration of the PLL 10 is not limited thereto, but any member which can smooth a signal may be provided.

Furthermore, in the above-described example embodiment, the motor 2 in the test apparatus 1 is driven by the drive controller 6 including the PLL 10. However, the application of the PLL 10 is not limited thereto, but the PLL 10 may be applied to a drive controller for driving a spindle motor incorporated in an apparatus other than a test apparatus. Specifically, the PLL 10 may be applied to a processing machine, a thread winding machine or the like when a spindle motor is used for constant peripheral speed control.

For example, a known winding apparatus is configured such that speed control employed when a rotation body is accelerated or decelerated is changed after the rotation body reaches a predetermined rotational speed. When speed control is changed after the rotation body reaches the predetermined rotational speed, constant linear speed control for changing a rotational speed according to a diameter of a winding section is employed (see, for example, Japanese Patent Publication No. 63-101279). However, such control change is not preferable because the complexity of the configuration of a controller and control itself is increased. Moreover, in the above-described constant linear speed control, variation in the rotational speed of the rotation body with respect to variation in the diameter of the winding section becomes large, as compared to PLL control, and thus, the accuracy for the rotational speed is not high. Although it is also possible to apply single loop PLL control to the above-described winding apparatus, as described above, the following capability of the rotational speed of the rotation body when the frequency of an input signal varies is not good in single loop PLL control.

In contrast, when the PLL 10 is applied to the winding apparatus, the rotational speed of the rotation body can be caused to track variation in the diameter of the winding section with high accuracy. Specifically, when the frequency of the input signal greatly varies, i.e., for example, when the diameter of the winding section is rapidly and greatly changed, when the rotation body is accelerated or decelerated, and the like, the rotational speed of the rotation body is allowed to track variation in the frequency of the input signal by PLL control using the PLL 10 with high accuracy. Therefore, in the winding apparatus, a thread or the like can be wound around the rotation body in a short time with high accuracy without causing a winding break. Also, control change is not necessary after the rotation body reaches a predetermined rotational speed, and thus, the configuration of the controller for the motor and control itself can be simplified.

The above-described advantages can be achieved in the same manner when the PLL 10 is applied to a spindle motor incorporated in a processing machine as well as when the PLL 10 is applied to a winding apparatus. Specifically, when constant peripheral speed control is performed to a workpiece, the rotational speed of a rotation body is caused to track variation in the frequency of an input signal (variation in the diameter of the workpiece) by PLL control using the PLL 10 with high accuracy, and thus, reduction in processing time and increase of processing accuracy can be achieved. Also, it is not necessary to change control employed when the rotation body is accelerated or decelerated after the rotation body reaches a predetermined rotational speed, and thus, the configuration of the controller and control itself can be simplified.

As described above, the present invention is useful as a PLL, or the like, used for controlling a motor.

In the foregoing description, the invention has been described with reference to specific example embodiments thereof. It will, however, be evident that various modifications and changes may be made thereto without departing from the broader spirit and scope of the invention as set forth in the appended claims. The specification and drawings are, accordingly, to be regarded in an illustrative rather than in a restrictive sense.

What is claimed is:

1. A phase locked loop (PLL) for controlling a motor, comprising:
a first feedback loop; and
a second feedback loop,
wherein
the first feedback loop includes
an oscillator configured to generate a signal having a frequency corresponding to an input voltage to output the generated signal,
a first phase comparator configured to output a first phase difference signal corresponding to a phase difference between the signal output from the oscillator and an input signal, and
a first smoothing filter configured to smooth the first phase difference signal to output the smoothed signal as the input voltage to the oscillator, and the second feedback loop includes
a second phase comparator configured to output a second phase difference signal corresponding to a phase difference between a signal derived from the motor and having a frequency corresponding to a rotational speed of the motor and the input signal,
an adder configured to add the first phase difference signal and the second phase difference signal to output the resultant signal, and
a second smoothing filter configured to smooth the signal output from the adder to output the smoothed signal to the motor.

2. The PLL of claim 1, comprising:
multiple ones of the first feedback loop.

3. A spindle motor, comprising:
the PLL of claim 1;
a rotary shaft configured to be driven according to the smoothed signal output from the second smoothing filter of the PLL; and
a rotary encoder configured to generate the signal having the frequency corresponding to the rotational speed of the motor according to a rotation of the rotary shaft.

4. A test apparatus for testing an object by rotating the object, the apparatus comprising:
the spindle motor of claim 3; and
a table, attached to the rotary shaft, configured to rotate the object.

* * * * *